(12) United States Patent
Auchere et al.

(10) Patent No.: US 9,754,853 B2
(45) Date of Patent: Sep. 5, 2017

(54) ELECTRONIC DEVICE FURNISHED WITH A CONDUCTING LAYER AND METHOD OF FABRICATION

(71) Applicants: STMicroelectronics (Grenoble 2) SAS, Grenoble (FR); STMicroelectronics (Alps) SAS, Grenoble (FR)

(72) Inventors: David Auchere, St. Martin d'Heres (FR); Laurent Marechal, Bures sur Yvette (FR); Laurent Schwarz, La Buisse (FR); Yvon Imbs, Quaix en Chartreuse (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 15/050,216

(22) Filed: Feb. 22, 2016

(65) Prior Publication Data
US 2017/0062298 A1 Mar. 2, 2017

(30) Foreign Application Priority Data
Aug. 28, 2015 (FR) ...................................... 1557998

(51) Int. Cl.
*H01L 23/48* (2006.01)
*H01L 23/31* (2006.01)
(Continued)

(52) U.S. Cl.
CPC .......... *H01L 23/315* (2013.01); *H01L 21/486* (2013.01); *H01L 21/4853* (2013.01); *H01L 21/52* (2013.01); *H01L 21/56* (2013.01); *H01L 23/13* (2013.01); *H01L 23/3128* (2013.01); *H01L 23/49811* (2013.01); *H01L 23/49827* (2013.01); *H01L 23/645* (2013.01);
(Continued)

(58) Field of Classification Search
CPC ... H01L 23/315; H01L 23/13; H01L 23/49811
USPC ......................................................... 257/692
See application file for complete search history.

(56) References Cited

U.S. PATENT DOCUMENTS

2004/0217472 A1 11/2004 Aisenbrey et al.
2005/0285794 A1 12/2005 Tang et al.
(Continued)

FOREIGN PATENT DOCUMENTS

FR         2780551 A1    12/1999
WO    WO-2010057808 A1    5/2010

OTHER PUBLICATIONS

INPI Search Report and Written Opinion for FR 1557998 dated Jul. 8, 2016 (8 pages).

*Primary Examiner* — Anthony Ho
(74) *Attorney, Agent, or Firm* — Gardere Wynne Sewell LLP

(57) ABSTRACT

An electronic device includes a support board having a mounting face and an integrated circuit chip mounted on the mounting face. An encapsulation block embeds the integrated circuit chip, the encapsulation block extending above the integrated circuit chip and around the integrated circuit chip on the mounting face of the support board. The encapsulation block includes a front face with a hole passing through the encapsulation block to uncovering at least part of an electrical contact. A layer made of an electrically conducting material fills the hole to make electrical connection to the electrical contact and further extends over the front face of the encapsulation block.

19 Claims, 3 Drawing Sheets

(51) Int. Cl.
  *H01L 23/64* (2006.01)
  *H01L 23/66* (2006.01)
  *H01L 23/00* (2006.01)
  *H01Q 1/22* (2006.01)
  *H01L 21/48* (2006.01)
  *H01L 21/52* (2006.01)
  *H01L 21/56* (2006.01)
  *H01L 23/13* (2006.01)
  *H01L 23/498* (2006.01)

(52) U.S. Cl.
  CPC .............. *H01L 23/66* (2013.01); *H01L 24/81* (2013.01); *H01Q 1/2283* (2013.01); *H01L 2223/6677* (2013.01); *H01L 2224/16227* (2013.01); *H01L 2924/15311* (2013.01); *H01L 2924/1815* (2013.01)

(56) References Cited

U.S. PATENT DOCUMENTS

| | | |
|---|---|---|
| 2008/0184550 A1 | 8/2008 | Hwan et al. |
| 2009/0289343 A1 | 11/2009 | Chiu et al. |
| 2011/0049686 A1 | 3/2011 | Yun et al. |
| 2012/0062439 A1 | 3/2012 | Liao et al. |
| 2013/0009320 A1 | 1/2013 | Yoo et al. |
| 2013/0087895 A1 | 4/2013 | Upadhyayula et al. |
| 2015/0102500 A1 | 4/2015 | Coffy et al. |

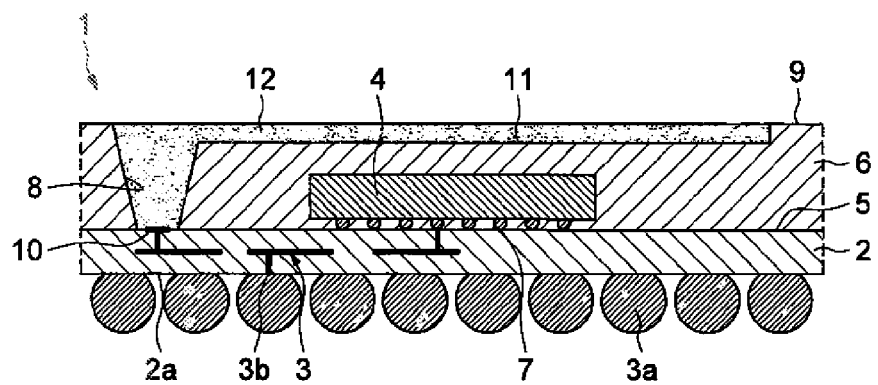
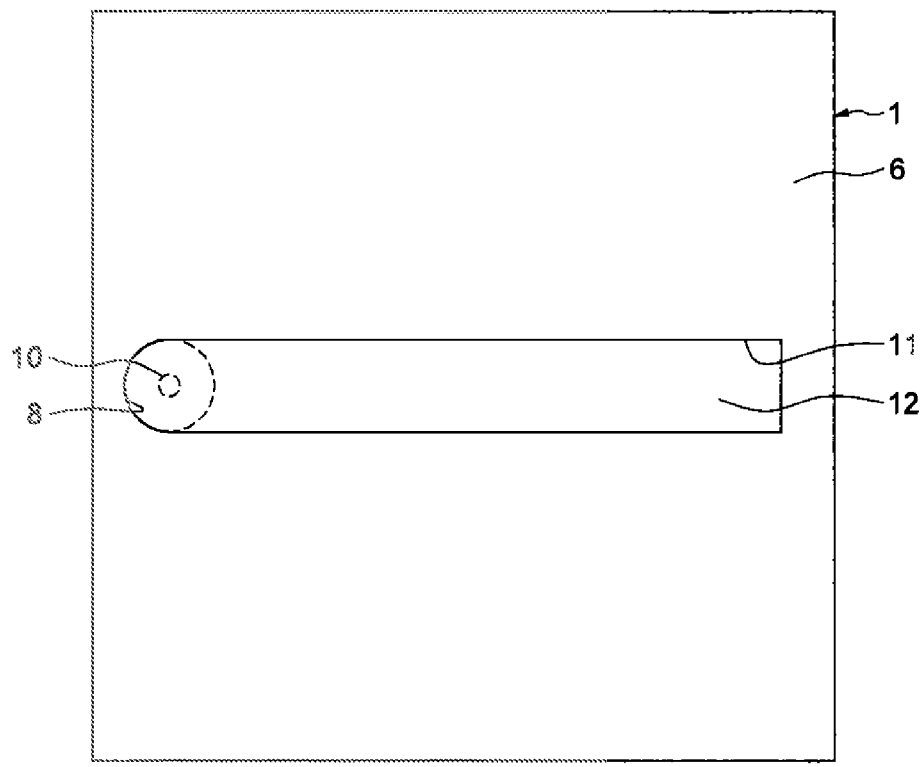

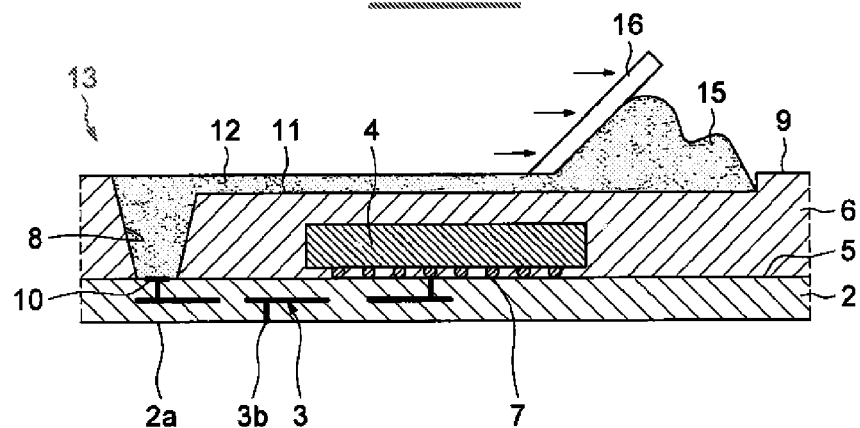
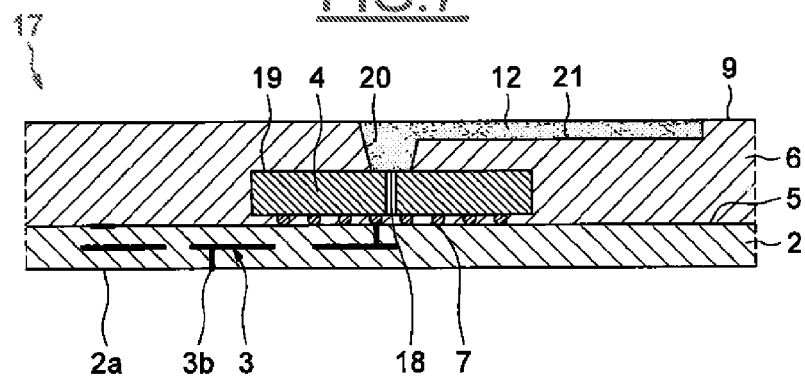
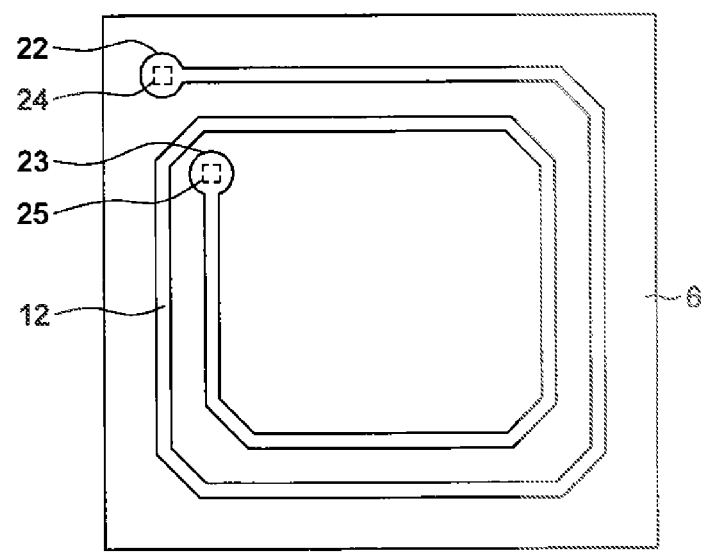

ELECTRONIC DEVICE FURNISHED WITH A CONDUCTING LAYER AND METHOD OF FABRICATION

PRIORITY CLAIM

This application claims priority from French Application for Patent No. 1557998 filed Aug. 28, 2015, the disclosure of which is incorporated by reference.

TECHNICAL FIELD

The present invention relates to the field of electronic devices.

BACKGROUND

Known electronic devices, generally of parallelepipedal shape, comprise a support board, including an electrical connection network, an integrated circuit chip mounted on one of the faces of the support board and an encapsulation block in which the chip is embedded. The chip is linked to the network of the support board by electrical connection elements, such as balls, interposed between the support board and the chip, or by electrical connection wires embedded in the encapsulation block.

Such electronic devices are mounted on printed circuit boards, generally by way of electrical connection elements, such as balls, linking the electrical connection network of the support boards and the electrical connection network of the printed circuit boards.

When the chips generate radiofrequency signals having to be transmitted or when they process radiofrequency signals received, the transmit or receive antennas are produced on the printed circuit boards. The electrical signals follow very long resistive paths which consist of lines of the electrical connection network of the printed circuit boards, the electrical connection elements between the printed circuit boards and the support boards, lines of the electrical connection network of the support boards and the electrical connection elements between the support boards. Such paths depend furthermore on the quality of the interconnections arising from fabrication.

The arrangements hereinabove constitute a handicap notably when the necessary dimension of the antennas, for the transmission of radiofrequency signals at frequencies of the order of a gigahertz or greater, or indeed much greater, than a gigahertz, becomes reduced.

SUMMARY

According to one embodiment, there is proposed an electronic device which comprises a support board exhibiting a mounting face, at least one integrated circuit chip mounted on the mounting face of the support board, an encapsulation block in which the chip is embedded, this encapsulation block extending above the chip and around the chip on the mounting face of the support board and exhibiting a front face, at least one through hole passing through the encapsulation block and uncovering at least in part an electrical contact of the mounting face of the support board or of the chip, and at least one layer made of an electrically conducting material, extended over the front face of the encapsulation block and linked to the electrical contact in the hole.

The electrical contact can be fashioned on the mounting face of the support board, remote from the periphery of the chip.

The electrical contact can be fashioned on a front face of the chip.

The encapsulation block can exhibit at least one groove in the front face, in which the conducting layer extends.

There is also proposed a method for fabricating an electronic device, in which use is made of a primary electronic device which comprises a support board, an integrated circuit chip mounted on a mounting face of the support board and an encapsulation block extending above the chip and around the chip on the mounting face of the support board, the encapsulation block exhibiting a front face parallel to the support board.

The method comprises: producing a hole through the encapsulation block of the primary electronic device, from the front face, until at least partially uncovering an electrical contact; depositing an electrically conducting liquid or pasty material on at least one zone of the front face of the encapsulation block and in the hole; and hardening the conducting material, so as to produce a conducting layer linked to the electrical contact.

The method can comprise: producing at least one groove in the front face of the encapsulation block, this groove emerging in the hole; the conducting material being subsequently deposited in this groove.

The method can comprise: producing at least two holes through the encapsulation block of the primary electronic device, from the front face, until at least partially uncovering two electrical contacts; depositing the electrically conducting liquid or pasty material on at least one zone of the front face of the encapsulation block and in the holes; and hardening the conducting material, so as to produce a conducting layer linked to the electrical contacts.

BRIEF DESCRIPTION OF THE DRAWINGS

Electronic devices and their modes of fabrication will now be described by way of exemplary embodiments, illustrated by the drawing in which:

FIG. 1 represents a section through an electronic device;

FIG. 2 represents a view from above of the electronic device of FIG. 1;

FIG. 6 represents another step of fabrication, in section, of the electronic device of FIG. 1;

FIG. 7 represents a section through another electronic device; and

FIG. 8 represents a section through another electronic device.

DETAILED DESCRIPTION

Figure 3:
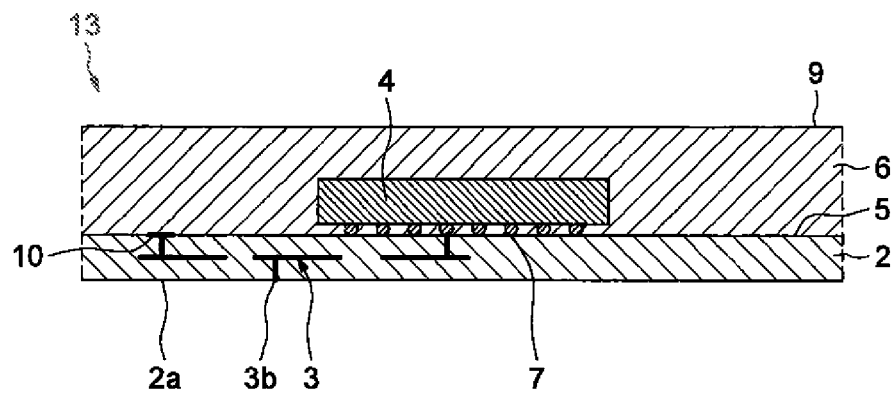
FIG. 3 represents a step of fabrication, in section, of the electronic device of FIG. 1.

As illustrated in FIGS. 1 and 2, according to an exemplary embodiment a final electronic device 1 comprises a support board 2, including an electrical connection network 3, an integrated circuit chip 4 mounted on a front mounting face 5 of the support board 2 and an encapsulation block 6 in which the chip 4 is embedded and which extends over the chip 4, around the latter, on the mounting face 5 of the support board 2, in such a way that the electronic device 1 takes the form of a parallelepiped.

According to one variant embodiment represented, the integrated circuit chip 4 is mounted on a mounting face 5 of the support board 2 by way of electrical connection elements 7, such as balls, which selectively link the chip 4 and the electrical connection network 3. According to another variant embodiment, the chip 4 could be glued on the mounting face 5 of the support board 2 and be linked to the electrical connection network 3 by electrical connection wires embedded in the encapsulation block 6.

According to one variant embodiment represented, the encapsulation block 6 exhibits a through hole 8 fashioned from a front face 9 of this block, parallel to the support board 2, until uncovering an electrical contact 10 of the electrical connection network fashioned on the mounting face 5 of the contact board. The through hole 8 is situated remote from the periphery of the chip 4 and from the periphery of the primary encapsulation block 6 and between same.

In the front face 9 of the encapsulation block 6 is fashioned an elongate groove 11 which emerges in the hole 8. For example, the groove 11 can pass above and remote from the chip 4.

The encapsulation block 6 is furnished with a layer 12 made of an electrically conducting material, extended over a zone of its front face 9 and which approximately fills the through hole 8 so as to be connected to the electrical contact 10 in this hole.

More precisely, the conducting layer 12 extends in the groove 11 so as to approximately fill this groove 11. The layer 12 is held by an adhesion effect on the encapsulation block 6.

The conducting layer 12 can be made of a hardened resin including electrically conducting metallic particles.

Moreover, the electronic device 1 can be furnished with elements for exterior electrical connection 3a, such as balls, disposed on electrical contacts 3b of the electrical connection network 3 fashioned on a face 2a of the support board 2, opposite the mounting face 5, these electrical contacts 3b being linked selectively to the electrical connection network 3 of the support board 2.

The final electronic device 1 can be produced in the following manner.

As illustrated in FIG. 3, use is made of a prefabricated primary electronic device 13 which comprises the support board 2, the chip 4 mounted as described above and the encapsulation block 6, the latter exhibiting a completely flat front face 9.

Figure 4:
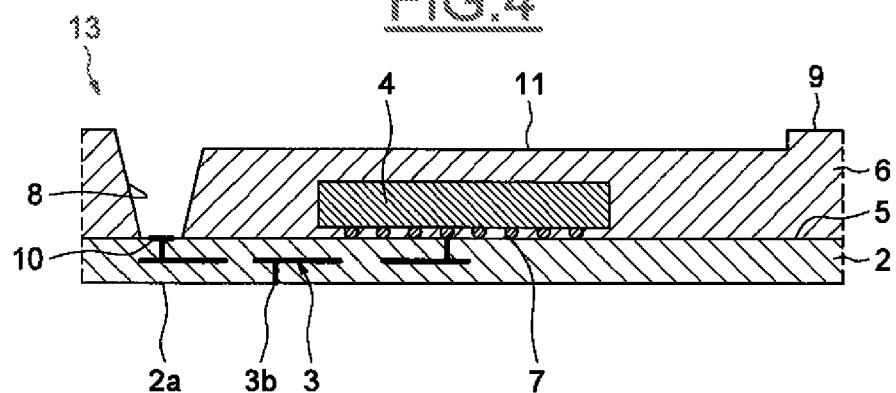
FIG. 4 represents another step of fabrication, in section, of the electronic device of FIG. 1.

As illustrated in FIG. 4, the hole 8 and the elongate groove 11 are produced.

Figure 5:
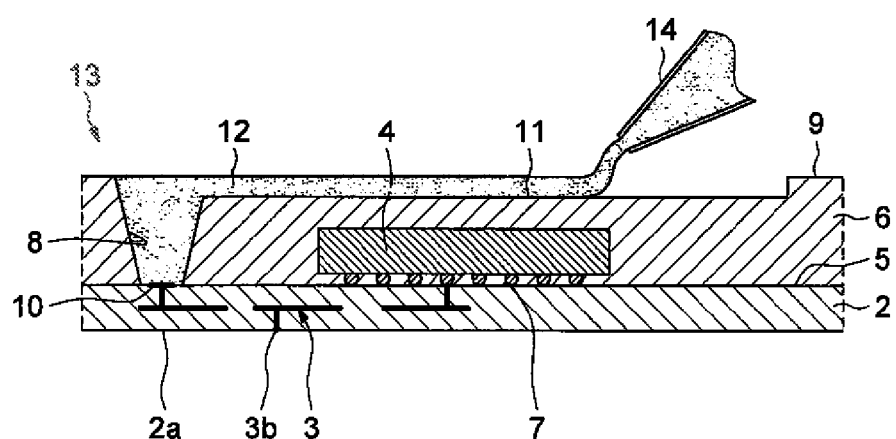
FIG. 5 represents another step of fabrication, in section, of the electronic device of FIG. 1.

Next, according to a variant embodiment illustrated in FIG. 5, a conducting layer 12 made of a liquid or pasty material, that is to say one able to creep or flow, is deposited in the hole 8 and in the groove 11 by means of a mobile syringe 14, the quantity of material deposited being able to approximately fill the hole 8 and the groove 11, the latter constituting a barrier to the creep of the material.

Or else, according to another variant embodiment illustrated in FIG. 6, a quantity of conducting material 15 largely filling the hole 8 and the groove 11 is deposited and a scraping of this deposited material 15 is undertaken by means of a spatula 16 by moving the latter over the front face 9 of the encapsulation block 6 so as to leave only the conducting layer 12.

Next, a hardening of the deposited layer 12 is undertaken, for example under the effect of a radiation.

As illustrated in FIG. 7, according to another exemplary embodiment a final electronic device 17 is differentiated from the electronic device 1 described previously by the fact that, this time, the conducting layer 12 is linked directly to a specific electrical contact 18 provided on the front face 19 of the chip 4. The specific electrical contact 18 can result from the formation of an electrical link passing through the substrate of the integrated circuit chip 4, known by the name TSV ("Through Silicon Via").

In this exemplary embodiment, the fabrication step equivalent to that described with reference to FIG. 4 consists in producing a hole 20 in a location situated above the chip 4, through an encapsulation block 6, so as to uncover the electrical contact 18, and in producing a groove 21 emerging in this hole 20. The following steps in producing a conducting layer 12 are equivalent to those described with reference to FIGS. 5 and 6.

The electronic devices which have just been described can arise from a collective fabrication on a common support plate. The encapsulation blocks and the extra encapsulation blocks can be obtained by spreading of a liquid material, for example an epoxy resin, and then by hardening of this material.

The electronic devices which have just been described can arise from collective fabrication on a common support plate, as is known in the field of microelectronics.

Of course, the conducting layer 12 can exhibit any desired topographical shape.

The conducting layer 12 of the electronic devices which have just been described can advantageously constitute an electromagnetic antenna for the transmission/reception of radiofrequency signals at very high frequencies (reaching a gigahertz or greater than a gigahertz, or indeed several hundred gigahertz), linked to the chip 4 by short electrical connection paths, via the electrical connection network of the support board 2 (FIGS. 1-2) or directly (FIG. 7).

Nonetheless, according to a variant embodiment illustrated in FIG. 8, a conducting layer 12, for example produced in the form of a strip, can constitute an extra passive electronic component, such as a resistance or a choke, whose ends can be linked to the chip 4, via the electrical connection network 3 and/or directly, thereby constituting a bridge.

Accordingly, the ends of this conducting layer 12 can be linked, via two holes 22 and 23 fashioned through the encapsulation block 6 from its front face, in a manner equivalent to that described previously, to electrical contacts 24 and 25 fashioned either on the front face of the support board 2, or on the front face of the chip 4, or one on the front face of the support board and the other on the front face of the chip.

The invention claimed is:

1. An electronic device, comprising:
a support board having a mounting face;
an integrated circuit chip mounted on the mounting face of the support board;
an encapsulation block embedding the integrated circuit chip, said encapsulation block extending above the integrated circuit chip and around the integrated circuit chip on the mounting face of the support board, said encapsulation block further having a front face;
a hole passing through the encapsulation block and uncovering at least in part an electrical contact on the mounting face of the support board; and
a layer made of a resin containing electrical conducting metallic particles, the layer extending over the front face of the encapsulation block and within said hole and is connected to the electrical contact in the hole.

2. The device according to claim 1, wherein the electrical contact on the mounting face of the support board is located remote from a periphery of the integrated circuit chip.

3. The device according to claim 1, wherein the encapsulation block includes a groove in the front face, and wherein the layer of electrically conducting material is located within the groove to form a conducting layer.

4. An electronic device, comprising:
a support board having a mounting face;
an integrated circuit chip mounted on the mounting face of the support board;
an encapsulation block embedding the integrated circuit chip, said encapsulation block extending above the integrated circuit chip and around the integrated circuit chip on the mounting face of the support board, said encapsulation block further having a front face;
a hole passing through the encapsulation block and uncovering at least in part an electrical contact that is located on a front face of the integrated circuit chip; and
a layer made of an electrically conducting material that extends over the front face of the encapsulation block and is connected to the electrical contact in the hole.

5. The device according to claim 4, wherein the encapsulation block includes a groove in the front face, and wherein the layer of electrically conducting material is located within the groove to form a conducting layer.

6. An electronic device, comprising:
an encapsulation block embedding an integrated circuit chip, said encapsulation block including a first opening that at least partially uncovers a first electrical contact; and
a layer made of a resin containing electrically conducting metallic particles, the layer extending over a front face of the encapsulation block and in said first opening and is connected to the first electrical contact in the first opening.

7. The device of claim 6, wherein the layer completely fills the first opening.

8. The device of claim 6, wherein said first electrical contact is a contact on a support substrate, said integrated circuit chip mounted to said support substrate.

9. The device of claim 6, wherein said encapsulation block further includes a second opening that at least partially uncovers a second electrical contact; and wherein said layer made of the electrically conducting material that extends over the front face of the encapsulation block to electrically connect the first electrical contact to the second electrical contact.

10. An electronic device, comprising:
an encapsulation block embedding an integrated circuit chip, said encapsulation block including a first opening that at least partially uncovers a first electrical contact; and
a layer made of an electrically conducting material that extends over a front face of the encapsulation block and is connected to the first electrical contact in the first opening,
wherein said first electrical contact is a contact on the integrated circuit chip.

11. The device of claim 10, wherein the layer completely fills the first opening.

12. The device of claim 10, wherein said encapsulation block further includes a second opening that at least partially uncovers a second electrical contact; and wherein said layer made of the electrically conducting material that extends over the front face of the encapsulation block to electrically connect the first electrical contact to the second electrical contact.

13. An electronic device, comprising:
a primary electronic device comprising a support board and an integrated circuit chip mounted on a mounting face of the support board;
an encapsulation block encapsulating the primary electronic device and having a front face parallel to the support board, wherein said encapsulation block includes a first hole extending through the encapsulation block from said front face to at least partially uncover a first electrical contact; and
a resin containing electrically conducting metallic particles in said first hole in electrical connection with the first electrical contact and extending on at least one zone of the front face of the encapsulation block.

14. The device according to claim 13, further comprising: a groove in the front face of the encapsulation block, said groove connecting to said first hole; wherein the electrically conducting material fills said groove.

15. The device according to claim 13,
wherein said encapsulating block hole further comprises a second hole extending through the encapsulation block from said front face to at least partially uncover a second electrical contact;
wherein said electrically conducting material is further in said second hole in electrical connection with the second electrical contact.

16. An electronic device, comprising:
a primary electronic device comprising a support board and an integrated circuit chip mounted on a mounting face of the support board;
an encapsulation block encapsulating the primary electronic device and having a front face parallel to the support board, wherein said encapsulation block includes a first hole extending through the encapsulation block from said front face to at least partially uncover a first electrical contact; and
an electrically conducting material in said first hole in electrical connection with the first electrical contact and extending on at least one zone of the front face of the encapsulation block;
wherein said encapsulating block hole further comprises a second hole extending through the encapsulation block from said front face to at least partially uncover a second electrical contact;
wherein said electrically conducting material is further in said second hole in electrical connection with the second electrical contact, and
wherein said electrically conducting material extending on said at least one zone of the front face of the encapsulation block electrically interconnects the first and second electrical contacts.

17. The device according to claim 16, wherein said electrically conducting material extending on said at least one zone of the front face of the encapsulation block forms an antenna.

18. The device according to claim 16, wherein said electrically conducting material extending on said at least one zone of the front face of the encapsulation block forms a choke.

19. The device according to claim 16, wherein said electrically conducting material extending on said at least one zone of the front face of the encapsulation block forms a coil.

* * * * *

UNITED STATES PATENT AND TRADEMARK OFFICE
CERTIFICATE OF CORRECTION

PATENT NO. : 9,754,853 B2  
APPLICATION NO. : 15/050216  
DATED : September 5, 2017  
INVENTOR(S) : David Auchere et al.

Page 1 of 1

It is certified that error appears in the above-identified patent and that said Letters Patent is hereby corrected as shown below:

In the Claims

At Column 6, Claim number 15, Line number 23, please delete the word "hole".

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*